United States Patent
Zhang et al.

(10) Patent No.: US 8,883,017 B1
(45) Date of Patent: Nov. 11, 2014

(54) METHOD AND SYSTEM FOR PROVIDING A READ TRANSDUCER HAVING SEAMLESS INTERFACES

(71) Applicant: Western Digital (Fremont), LLC, Fremont, CA (US)

(72) Inventors: Zhihong Zhang, Fremont, CA (US); Guanxiong Li, Fremont, CA (US); Ming Mao, Dublin, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 60 days.

(21) Appl. No.: 13/797,221

(22) Filed: Mar. 12, 2013

(51) Int. Cl.
*B44C 1/22* (2006.01)
*G11B 5/39* (2006.01)
*H01L 43/12* (2006.01)
*G11B 5/31* (2006.01)
*G11B 5/127* (2006.01)

(52) U.S. Cl.
CPC .............. *G11B 5/127* (2013.01); *G11B 5/3906* (2013.01); *G11B 5/3903* (2013.01); *H01L 43/12* (2013.01); *G11B 5/313* (2013.01); *G11B 5/314* (2013.01)
USPC .......................................................... 216/22

(58) Field of Classification Search
CPC .. G01R 33/098; G01R 33/093; G11B 5/3909; G11B 5/3906; G11B 5/3932; G11B 2005/001; G11B 5/314; G11B 5/313; G11B 5/3903; G11B 2005/0013; B82Y 10/00; H01L 43/12; H01L 21/02041
See application file for complete search history.

(56) References Cited

U.S. PATENT DOCUMENTS

| | | | |
|---|---|---|---|
| 5,680,282 A * | 10/1997 | Alhert et al. ................. | 360/322 |
| 6,016,290 A | 1/2000 | Chen et al. | |
| 6,018,441 A | 1/2000 | Wu et al. | |
| 6,025,978 A | 2/2000 | Hoshi et al. | |
| 6,025,988 A | 2/2000 | Yan | |
| 6,032,353 A | 3/2000 | Hiner et al. | |
| 6,033,491 A * | 3/2000 | Lin .............................. | 148/108 |
| 6,033,532 A | 3/2000 | Minami | |
| 6,034,851 A | 3/2000 | Zarouri et al. | |
| 6,043,959 A | 3/2000 | Crue et al. | |
| 6,046,885 A | 4/2000 | Aimonetti et al. | |
| 6,049,650 A | 4/2000 | Jerman et al. | |
| 6,055,138 A | 4/2000 | Shi | |

(Continued)

OTHER PUBLICATIONS (Xiaotian Zhou, et al.), U.S. Appl. No. 13/717,057, filed Dec. 17, 2012, 29 pages.

(Continued)

*Primary Examiner* — Duy Deo
*Assistant Examiner* — Erin Bergner

(57) ABSTRACT

A method and system provide a substantially seamless interface in a magnetic transducer. The magnetic recording transducer includes a first layer and a second layer on the first layer. The second layer is different from the first layer. The first layer consists of at least one material. The method includes removing at least the second layer using a first removal process. A residue of the second layer and a first portion of the first layer remain after the first removal process. A first sacrificial layer consists of the at least one material on the first portion of the first layer. At least the first sacrificial layer is removed using a second removal process. A second portion of the first layer remains after completion of the second removal process. An additional structure is provided. The seamless interface is between the second portion of the first layer and the additional structure.

22 Claims, 9 Drawing Sheets

(56) References Cited

U.S. PATENT DOCUMENTS

| | | | |
|---|---|---|---|
| 6,058,094 A | 5/2000 | Davis et al. |
| 6,073,338 A | 6/2000 | Liu et al. |
| 6,078,479 A | 6/2000 | Nepela et al. |
| 6,081,499 A | 6/2000 | Berger et al. |
| 6,094,803 A | 8/2000 | Carlson et al. |
| 6,099,362 A | 8/2000 | Viches et al. |
| 6,103,073 A | 8/2000 | Thayamballi |
| 6,108,166 A | 8/2000 | Lederman |
| 6,118,629 A | 9/2000 | Huai et al. |
| 6,118,638 A | 9/2000 | Knapp et al. |
| 6,125,018 A | 9/2000 | Takagishi et al. |
| 6,130,779 A | 10/2000 | Carlson et al. |
| 6,134,089 A | 10/2000 | Barr et al. |
| 6,136,166 A | 10/2000 | Shen et al. |
| 6,137,661 A | 10/2000 | Shi et al. |
| 6,137,662 A | 10/2000 | Huai et al. |
| 6,160,684 A | 12/2000 | Heist et al. |
| 6,163,426 A | 12/2000 | Nepela et al. |
| 6,166,891 A | 12/2000 | Lederman et al. |
| 6,173,486 B1 | 1/2001 | Hsiao et al. |
| 6,175,476 B1 | 1/2001 | Huai et al. |
| 6,178,066 B1 | 1/2001 | Barr |
| 6,178,070 B1 | 1/2001 | Hong et al. |
| 6,178,150 B1 | 1/2001 | Davis |
| 6,181,485 B1 | 1/2001 | He |
| 6,181,525 B1 | 1/2001 | Carlson |
| 6,185,051 B1 | 2/2001 | Chen et al. |
| 6,185,077 B1 | 2/2001 | Tong et al. |
| 6,185,081 B1 | 2/2001 | Simion et al. |
| 6,188,549 B1 | 2/2001 | Wiitala |
| 6,190,764 B1 | 2/2001 | Shi et al. |
| 6,193,584 B1 | 2/2001 | Rudy et al. |
| 6,195,229 B1 | 2/2001 | Shen et al. |
| 6,198,608 B1 | 3/2001 | Hong et al. |
| 6,198,609 B1 | 3/2001 | Barr et al. |
| 6,201,673 B1 | 3/2001 | Rottmayer et al. |
| 6,204,998 B1 | 3/2001 | Katz |
| 6,204,999 B1 | 3/2001 | Crue et al. |
| 6,212,153 B1 | 4/2001 | Chen et al. |
| 6,215,625 B1 | 4/2001 | Carlson |
| 6,219,205 B1 | 4/2001 | Yuan et al. |
| 6,221,218 B1 | 4/2001 | Shi et al. |
| 6,222,707 B1 | 4/2001 | Huai et al. |
| 6,228,748 B1 * | 5/2001 | Anderson et al. ............ 438/476 |
| 6,229,782 B1 | 5/2001 | Wang et al. |
| 6,230,959 B1 | 5/2001 | Heist et al. |
| 6,233,116 B1 | 5/2001 | Chen et al. |
| 6,233,125 B1 | 5/2001 | Knapp et al. |
| 6,237,215 B1 | 5/2001 | Hunsaker et al. |
| 6,252,743 B1 | 6/2001 | Bozorgi |
| 6,255,721 B1 | 7/2001 | Roberts |
| 6,258,468 B1 | 7/2001 | Mahvan et al. |
| 6,266,216 B1 | 7/2001 | Hikami et al. |
| 6,271,604 B1 | 8/2001 | Frank, Jr. et al. |
| 6,275,354 B1 | 8/2001 | Huai et al. |
| 6,277,505 B1 | 8/2001 | Shi et al. |
| 6,282,056 B1 | 8/2001 | Feng et al. |
| 6,296,955 B1 | 10/2001 | Hossain et al. |
| 6,297,955 B1 | 10/2001 | Frank, Jr. et al. |
| 6,304,414 B1 | 10/2001 | Crue, Jr. et al. |
| 6,307,715 B1 | 10/2001 | Berding et al. |
| 6,310,746 B1 | 10/2001 | Hawwa et al. |
| 6,310,750 B1 | 10/2001 | Hawwa et al. |
| 6,317,290 B1 | 11/2001 | Wang et al. |
| 6,317,297 B1 | 11/2001 | Tong et al. |
| 6,322,911 B1 | 11/2001 | Fukagawa et al. |
| 6,330,136 B1 | 12/2001 | Wang et al. |
| 6,330,137 B1 | 12/2001 | Knapp et al. |
| 6,333,830 B2 | 12/2001 | Rose et al. |
| 6,340,533 B1 | 1/2002 | Ueno et al. |
| 6,349,014 B1 | 2/2002 | Crue, Jr. et al. |
| 6,351,355 B1 | 2/2002 | Min et al. |
| 6,353,318 B1 | 3/2002 | Sin et al. |
| 6,353,511 B1 | 3/2002 | Shi et al. |
| 6,356,412 B1 | 3/2002 | Levi et al. |
| 6,359,779 B1 | 3/2002 | Frank, Jr. et al. |
| 6,369,983 B1 | 4/2002 | Hong |
| 6,376,964 B1 | 4/2002 | Young et al. |
| 6,377,535 B1 | 4/2002 | Chen et al. |
| 6,381,095 B1 | 4/2002 | Sin et al. |
| 6,381,105 B1 | 4/2002 | Huai et al. |
| 6,389,499 B1 | 5/2002 | Frank, Jr. et al. |
| 6,392,850 B1 | 5/2002 | Tong et al. |
| 6,396,660 B1 | 5/2002 | Jensen et al. |
| 6,399,179 B1 | 6/2002 | Hanrahan et al. |
| 6,400,526 B2 | 6/2002 | Crue, Jr. et al. |
| 6,404,600 B1 | 6/2002 | Hawwa et al. |
| 6,404,601 B1 | 6/2002 | Rottmayer et al. |
| 6,404,706 B1 | 6/2002 | Stovall et al. |
| 6,410,170 B1 | 6/2002 | Chen et al. |
| 6,411,522 B1 | 6/2002 | Frank, Jr. et al. |
| 6,417,998 B1 | 7/2002 | Crue, Jr. et al. |
| 6,417,999 B1 | 7/2002 | Knapp et al. |
| 6,418,000 B1 | 7/2002 | Gibbons et al. |
| 6,418,048 B1 | 7/2002 | Sin et al. |
| 6,421,211 B1 | 7/2002 | Hawwa et al. |
| 6,421,212 B1 | 7/2002 | Gibbons et al. |
| 6,424,505 B1 | 7/2002 | Lam et al. |
| 6,424,507 B1 | 7/2002 | Lederman et al. |
| 6,430,009 B1 | 8/2002 | Komaki et al. |
| 6,430,806 B1 | 8/2002 | Chen et al. |
| 6,433,965 B1 | 8/2002 | Gopinathan et al. |
| 6,433,968 B1 | 8/2002 | Shi et al. |
| 6,433,970 B1 | 8/2002 | Knapp et al. |
| 6,437,945 B1 | 8/2002 | Hawwa et al. |
| 6,445,536 B1 | 9/2002 | Rudy et al. |
| 6,445,542 B1 | 9/2002 | Levi et al. |
| 6,445,553 B2 | 9/2002 | Barr et al. |
| 6,445,554 B1 | 9/2002 | Dong et al. |
| 6,447,935 B1 | 9/2002 | Zhang et al. |
| 6,448,765 B1 | 9/2002 | Chen et al. |
| 6,451,514 B1 | 9/2002 | Iitsuka |
| 6,452,742 B1 | 9/2002 | Crue et al. |
| 6,452,765 B1 | 9/2002 | Mahvan et al. |
| 6,456,465 B1 | 9/2002 | Louis et al. |
| 6,459,552 B1 | 10/2002 | Liu et al. |
| 6,462,920 B1 | 10/2002 | Karimi |
| 6,466,401 B1 | 10/2002 | Hong et al. |
| 6,466,402 B1 | 10/2002 | Crue, Jr. et al. |
| 6,466,404 B1 | 10/2002 | Crue, Jr. et al. |
| 6,468,436 B1 | 10/2002 | Shi et al. |
| 6,469,877 B1 | 10/2002 | Knapp et al. |
| 6,477,019 B2 | 11/2002 | Matono et al. |
| 6,479,096 B1 | 11/2002 | Shi et al. |
| 6,483,662 B1 | 11/2002 | Thomas et al. |
| 6,487,040 B1 | 11/2002 | Hsiao et al. |
| 6,487,056 B1 | 11/2002 | Gibbons et al. |
| 6,490,125 B1 | 12/2002 | Barr |
| 6,496,330 B1 | 12/2002 | Crue, Jr. et al. |
| 6,496,334 B1 | 12/2002 | Pang et al. |
| 6,504,676 B1 | 1/2003 | Hiner et al. |
| 6,512,657 B2 | 1/2003 | Heist et al. |
| 6,512,659 B1 | 1/2003 | Hawwa et al. |
| 6,512,661 B1 | 1/2003 | Louis |
| 6,512,690 B1 | 1/2003 | Qi et al. |
| 6,515,573 B1 | 2/2003 | Dong et al. |
| 6,515,791 B1 | 2/2003 | Hawwa et al. |
| 6,532,823 B1 | 3/2003 | Knapp et al. |
| 6,535,363 B1 | 3/2003 | Hosomi et al. |
| 6,552,874 B1 | 4/2003 | Chen et al. |
| 6,552,928 B1 | 4/2003 | Qi et al. |
| 6,577,470 B1 | 6/2003 | Rumpler |
| 6,583,961 B2 | 6/2003 | Levi et al. |
| 6,583,968 B1 | 6/2003 | Scura et al. |
| 6,597,548 B1 | 7/2003 | Yamanaka et al. |
| 6,611,398 B1 | 8/2003 | Rumpler et al. |
| 6,618,223 B1 | 9/2003 | Chen et al. |
| 6,629,357 B1 | 10/2003 | Akoh |
| 6,633,464 B2 | 10/2003 | Lai et al. |
| 6,636,394 B1 | 10/2003 | Fukagawa et al. |
| 6,639,291 B1 | 10/2003 | Sin et al. |
| 6,650,503 B1 | 11/2003 | Chen et al. |
| 6,650,506 B1 | 11/2003 | Risse |
| 6,654,195 B1 | 11/2003 | Frank, Jr. et al. |

(56) References Cited

U.S. PATENT DOCUMENTS

| | | |
|---|---|---|
| 6,657,816 B1 | 12/2003 | Barr et al. |
| 6,661,621 B1 | 12/2003 | Iitsuka |
| 6,661,625 B1 | 12/2003 | Sin et al. |
| 6,674,610 B1 | 1/2004 | Thomas et al. |
| 6,680,863 B1 | 1/2004 | Shi et al. |
| 6,683,763 B1 | 1/2004 | Hiner et al. |
| 6,687,098 B1 | 2/2004 | Huai |
| 6,687,178 B1 | 2/2004 | Qi et al. |
| 6,687,977 B2 | 2/2004 | Knapp et al. |
| 6,691,226 B1 | 2/2004 | Frank, Jr. et al. |
| 6,697,294 B1 | 2/2004 | Qi et al. |
| 6,700,738 B1 | 3/2004 | Sin et al. |
| 6,700,759 B1 | 3/2004 | Knapp et al. |
| 6,704,158 B2 | 3/2004 | Hawwa et al. |
| 6,707,083 B1 | 3/2004 | Hiner et al. |
| 6,713,801 B1 | 3/2004 | Sin et al. |
| 6,721,138 B1 | 4/2004 | Chen et al. |
| 6,721,149 B1 | 4/2004 | Shi et al. |
| 6,721,203 B1 | 4/2004 | Qi et al. |
| 6,724,569 B1 | 4/2004 | Chen et al. |
| 6,724,572 B1 | 4/2004 | Stoev et al. |
| 6,729,015 B2 | 5/2004 | Matono et al. |
| 6,735,850 B1 | 5/2004 | Gibbons et al. |
| 6,737,281 B1 | 5/2004 | Dang et al. |
| 6,744,608 B1 | 6/2004 | Sin et al. |
| 6,747,301 B1 | 6/2004 | Hiner et al. |
| 6,751,055 B1 | 6/2004 | Alfoqaha et al. |
| 6,754,049 B1 | 6/2004 | Seagle et al. |
| 6,756,071 B1 | 6/2004 | Shi et al. |
| 6,757,140 B1 | 6/2004 | Hawwa |
| 6,760,196 B1 | 7/2004 | Niu et al. |
| 6,762,910 B1 | 7/2004 | Knapp et al. |
| 6,765,756 B1 | 7/2004 | Hong et al. |
| 6,775,902 B1 | 8/2004 | Huai et al. |
| 6,778,358 B1 | 8/2004 | Jiang et al. |
| 6,781,927 B1 | 8/2004 | Heanuc et al. |
| 6,785,955 B1 | 9/2004 | Chen et al. |
| 6,791,793 B1 | 9/2004 | Chen et al. |
| 6,791,807 B1 | 9/2004 | Hikami et al. |
| 6,798,616 B1 | 9/2004 | Seagle et al. |
| 6,798,625 B1 | 9/2004 | Ueno et al. |
| 6,801,408 B1 | 10/2004 | Chen et al. |
| 6,801,411 B1 | 10/2004 | Lederman et al. |
| 6,803,615 B1 | 10/2004 | Sin et al. |
| 6,806,035 B1 | 10/2004 | Atireklapvarodom et al. |
| 6,807,030 B1 | 10/2004 | Hawwa et al. |
| 6,807,332 B1 | 10/2004 | Hawwa |
| 6,809,899 B1 | 10/2004 | Chen et al. |
| 6,816,345 B1 | 11/2004 | Knapp et al. |
| 6,828,897 B1 | 12/2004 | Nepela |
| 6,829,160 B1 | 12/2004 | Qi et al. |
| 6,829,819 B1 | 12/2004 | Crue, Jr. et al. |
| 6,833,979 B1 | 12/2004 | Knapp et al. |
| 6,834,010 B1 | 12/2004 | Qi et al. |
| 6,859,343 B1 | 2/2005 | Alfoqaha et al. |
| 6,859,997 B1 | 3/2005 | Tong et al. |
| 6,861,937 B1 | 3/2005 | Feng et al. |
| 6,870,712 B2 | 3/2005 | Chen et al. |
| 6,873,494 B2 | 3/2005 | Chen et al. |
| 6,873,547 B1 | 3/2005 | Shi et al. |
| 6,879,464 B2 | 4/2005 | Sun et al. |
| 6,888,184 B1 | 5/2005 | Shi et al. |
| 6,888,704 B1 | 5/2005 | Diao et al. |
| 6,891,702 B1 | 5/2005 | Tang |
| 6,894,871 B2 | 5/2005 | Alfoqaha et al. |
| 6,894,877 B1 | 5/2005 | Crue, Jr. et al. |
| 6,906,894 B2 | 6/2005 | Chen et al. |
| 6,909,578 B1 | 6/2005 | Missell et al. |
| 6,912,106 B1 | 6/2005 | Chen et al. |
| 6,934,113 B1 | 8/2005 | Chen |
| 6,934,129 B1 | 8/2005 | Zhang et al. |
| 6,940,688 B2 | 9/2005 | Jiang et al. |
| 6,942,824 B1 | 9/2005 | Li |
| 6,943,993 B2 | 9/2005 | Chang et al. |
| 6,944,938 B1 | 9/2005 | Crue, Jr. et al. |
| 6,947,258 B1 | 9/2005 | Li |
| 6,950,266 B1 | 9/2005 | McCaslin et al. |
| 6,954,332 B1 | 10/2005 | Hong et al. |
| 6,958,885 B1 | 10/2005 | Chen et al. |
| 6,961,221 B1 | 11/2005 | Niu et al. |
| 6,969,989 B1 | 11/2005 | Mei |
| 6,975,486 B2 | 12/2005 | Chen et al. |
| 6,987,643 B1 | 1/2006 | Seagle |
| 6,989,962 B1 | 1/2006 | Dong et al. |
| 6,989,972 B1 | 1/2006 | Stoev et al. |
| 7,006,327 B2 | 2/2006 | Krounbi et al. |
| 7,007,372 B1 | 3/2006 | Chen et al. |
| 7,012,832 B1 | 3/2006 | Sin et al. |
| 7,023,658 B1 | 4/2006 | Knapp et al. |
| 7,026,063 B2 | 4/2006 | Ueno et al. |
| 7,027,268 B1 | 4/2006 | Zhu et al. |
| 7,027,274 B1 | 4/2006 | Sin et al. |
| 7,035,046 B1 | 4/2006 | Young et al. |
| 7,041,985 B1 | 5/2006 | Wang et al. |
| 7,046,490 B1 | 5/2006 | Ueno et al. |
| 7,054,113 B1 | 5/2006 | Seagle et al. |
| 7,057,857 B1 | 6/2006 | Niu et al. |
| 7,059,868 B1 | 6/2006 | Yan |
| 7,092,195 B1 | 8/2006 | Liu et al. |
| 7,110,289 B1 | 9/2006 | Sin et al. |
| 7,111,382 B1 | 9/2006 | Knapp et al. |
| 7,113,366 B1 | 9/2006 | Wang et al. |
| 7,114,241 B2 | 10/2006 | Kubota et al. |
| 7,116,517 B1 | 10/2006 | He et al. |
| 7,124,654 B1 | 10/2006 | Davies et al. |
| 7,126,788 B1 | 10/2006 | Liu et al. |
| 7,126,790 B1 | 10/2006 | Liu et al. |
| 7,131,346 B1 | 11/2006 | Buttar et al. |
| 7,133,253 B1 | 11/2006 | Seagle et al. |
| 7,134,185 B1 | 11/2006 | Knapp et al. |
| 7,154,715 B2 | 12/2006 | Yamanaka et al. |
| 7,170,725 B1 | 1/2007 | Zhou et al. |
| 7,177,117 B1 | 2/2007 | Jiang et al. |
| 7,193,815 B1 | 3/2007 | Stoev et al. |
| 7,196,880 B1 | 3/2007 | Anderson et al. |
| 7,199,974 B1 | 4/2007 | Alfoqaha |
| 7,199,975 B1 | 4/2007 | Pan |
| 7,211,339 B1 | 5/2007 | Seagle et al. |
| 7,212,384 B1 | 5/2007 | Stoev et al. |
| 7,238,292 B1 | 7/2007 | He et al. |
| 7,239,478 B1 | 7/2007 | Sin et al. |
| 7,248,431 B1 | 7/2007 | Liu et al. |
| 7,248,433 B1 | 7/2007 | Stoev et al. |
| 7,248,449 B1 | 7/2007 | Seagle |
| 7,280,325 B1 | 10/2007 | Pan |
| 7,283,327 B1 | 10/2007 | Liu et al. |
| 7,284,316 B1 | 10/2007 | Huai et al. |
| 7,286,329 B1 | 10/2007 | Chen et al. |
| 7,289,303 B1 | 10/2007 | Sin et al. |
| 7,292,409 B1 | 11/2007 | Stoev et al. |
| 7,296,339 B1 | 11/2007 | Yang et al. |
| 7,307,814 B1 | 12/2007 | Seagle et al. |
| 7,307,818 B1 | 12/2007 | Park et al. |
| 7,310,204 B1 | 12/2007 | Stoev et al. |
| 7,318,947 B1 | 1/2008 | Park et al. |
| 7,333,295 B1 | 2/2008 | Medina et al. |
| 7,337,530 B1 | 3/2008 | Stoev et al. |
| 7,342,752 B1 | 3/2008 | Zhang et al. |
| 7,349,170 B1 | 3/2008 | Rudman et al. |
| 7,349,179 B1 | 3/2008 | He et al. |
| 7,354,664 B1 | 4/2008 | Jiang et al. |
| 7,363,697 B1 | 4/2008 | Dunn et al. |
| 7,371,152 B1 | 5/2008 | Newman |
| 7,372,665 B1 | 5/2008 | Stoev et al. |
| 7,375,926 B1 | 5/2008 | Stoev et al. |
| 7,379,269 B1 | 5/2008 | Krounbi et al. |
| 7,386,933 B1 | 6/2008 | Krounbi et al. |
| 7,389,577 B1 | 6/2008 | Shang et al. |
| 7,417,832 B1 | 8/2008 | Erickson et al. |
| 7,419,891 B1 | 9/2008 | Chen et al. |
| 7,428,124 B1 | 9/2008 | Song et al. |
| 7,430,098 B1 | 9/2008 | Song et al. |
| 7,436,620 B1 | 10/2008 | Kang et al. |
| 7,436,638 B1 | 10/2008 | Pan |

(56) References Cited

U.S. PATENT DOCUMENTS

| | | |
|---|---|---|
| 7,440,220 B1 | 10/2008 | Kang et al. |
| 7,443,632 B1 | 10/2008 | Stoev et al. |
| 7,444,740 B1 | 11/2008 | Chung et al. |
| 7,493,688 B1 | 2/2009 | Wang et al. |
| 7,508,627 B1 | 3/2009 | Zhang et al. |
| 7,522,377 B1 | 4/2009 | Jiang et al. |
| 7,522,379 B1 | 4/2009 | Krounbi et al. |
| 7,522,382 B1 | 4/2009 | Pan |
| 7,523,550 B2 | 4/2009 | Baer et al. |
| 7,542,246 B1 | 6/2009 | Song et al. |
| 7,551,406 B1 | 6/2009 | Thomas et al. |
| 7,552,523 B1 | 6/2009 | He et al. |
| 7,554,767 B1 | 6/2009 | Hu et al. |
| 7,583,466 B2 | 9/2009 | Kermiche et al. |
| 7,595,967 B1 | 9/2009 | Moon et al. |
| 7,639,456 B2 | 12/2009 | Hong et al. |
| 7,639,457 B1 | 12/2009 | Chen et al. |
| 7,660,080 B1 | 2/2010 | Liu et al. |
| 7,672,080 B1 | 3/2010 | Tang et al. |
| 7,672,086 B1 | 3/2010 | Jiang |
| 7,684,160 B1 | 3/2010 | Erickson et al. |
| 7,688,546 B1 | 3/2010 | Bai et al. |
| 7,691,434 B1 | 4/2010 | Zhang et al. |
| 7,695,761 B1 | 4/2010 | Shen et al. |
| 7,719,795 B2 | 5/2010 | Hu et al. |
| 7,726,009 B1 | 6/2010 | Liu et al. |
| 7,729,086 B1 | 6/2010 | Song et al. |
| 7,729,087 B1 | 6/2010 | Stoev et al. |
| 7,736,823 B1 | 6/2010 | Wang et al. |
| 7,765,676 B2 | 8/2010 | Cyrille et al. |
| 7,785,666 B1 | 8/2010 | Sun et al. |
| 7,796,356 B1 | 9/2010 | Fowler et al. |
| 7,800,858 B1 | 9/2010 | Bajikar et al. |
| 7,819,979 B1 | 10/2010 | Chen et al. |
| 7,829,264 B1 | 11/2010 | Wang et al. |
| 7,846,643 B1 | 12/2010 | Sun et al. |
| 7,855,854 B2 | 12/2010 | Hu et al. |
| 7,869,160 B1 | 1/2011 | Pan et al. |
| 7,872,824 B1 | 1/2011 | Macchioni et al. |
| 7,872,833 B2 | 1/2011 | Hu et al. |
| 7,910,267 B1 | 3/2011 | Zeng et al. |
| 7,911,735 B1 | 3/2011 | Sin et al. |
| 7,911,737 B1 | 3/2011 | Jiang et al. |
| 7,916,426 B2 | 3/2011 | Hu et al. |
| 7,918,013 B1 | 4/2011 | Dunn et al. |
| 7,968,219 B1 | 6/2011 | Jiang et al. |
| 7,982,989 B1 | 7/2011 | Shi et al. |
| 8,008,912 B1 | 8/2011 | Shang |
| 8,012,804 B1 | 9/2011 | Wang et al. |
| 8,015,692 B1 | 9/2011 | Zhang et al. |
| 8,018,677 B1 | 9/2011 | Chung et al. |
| 8,018,678 B1 | 9/2011 | Zhang et al. |
| 8,024,748 B1 | 9/2011 | Moravec et al. |
| 8,054,586 B2 | 11/2011 | Balamane et al. |
| 8,072,705 B1 | 12/2011 | Wang et al. |
| 8,074,345 B1 | 12/2011 | Anguelouch et al. |
| 8,077,418 B1 | 12/2011 | Hu et al. |
| 8,077,434 B1 | 12/2011 | Shen et al. |
| 8,077,435 B1 | 12/2011 | Liu et al. |
| 8,077,557 B1 | 12/2011 | Hu et al. |
| 8,079,135 B1 | 12/2011 | Shen et al. |
| 8,081,403 B1 | 12/2011 | Chen et al. |
| 8,091,210 B1 | 1/2012 | Sasaki et al. |
| 8,097,846 B1 | 1/2012 | Anguelouch et al. |
| 8,104,166 B1 | 1/2012 | Zhang et al. |
| 8,110,085 B2 | 2/2012 | Hsiao et al. |
| 8,116,043 B2 | 2/2012 | Leng et al. |
| 8,116,171 B1 | 2/2012 | Lee |
| 8,125,856 B1 | 2/2012 | Li et al. |
| 8,134,794 B1 | 3/2012 | Wang |
| 8,136,224 B1 | 3/2012 | Sun et al. |
| 8,136,225 B1 | 3/2012 | Zhang et al. |
| 8,136,805 B1 | 3/2012 | Lee |
| 8,137,570 B2 | 3/2012 | Le |
| 8,141,235 B1 | 3/2012 | Zhang |
| 8,146,236 B1 | 4/2012 | Luo et al. |
| 8,149,536 B1 | 4/2012 | Yang et al. |
| 8,151,441 B1 | 4/2012 | Rudy et al. |
| 8,163,185 B1 | 4/2012 | Sun et al. |
| 8,164,760 B2 | 4/2012 | Willis |
| 8,164,855 B1 | 4/2012 | Gibbons et al. |
| 8,164,864 B2 | 4/2012 | Kaiser et al. |
| 8,165,709 B1 | 4/2012 | Rudy |
| 8,166,631 B1 | 5/2012 | Tran et al. |
| 8,166,632 B1 | 5/2012 | Zhang et al. |
| 8,169,473 B1 | 5/2012 | Yu et al. |
| 8,171,618 B1 | 5/2012 | Wang et al. |
| 8,179,636 B1 | 5/2012 | Bai et al. |
| 8,191,237 B1 | 6/2012 | Luo et al. |
| 8,194,365 B1 | 6/2012 | Leng et al. |
| 8,194,366 B1 | 6/2012 | Li et al. |
| 8,196,285 B1 | 6/2012 | Zhang et al. |
| 8,200,054 B1 | 6/2012 | Li et al. |
| 8,203,800 B2 | 6/2012 | Li et al. |
| 8,208,350 B1 | 6/2012 | Hu et al. |
| 8,220,140 B1 | 7/2012 | Wang et al. |
| 8,222,599 B1 | 7/2012 | Chien |
| 8,225,488 B1 | 7/2012 | Zhang et al. |
| 8,227,023 B1 | 7/2012 | Liu et al. |
| 8,228,633 B1 | 7/2012 | Tran et al. |
| 8,231,796 B1 | 7/2012 | Li et al. |
| 8,233,248 B1 | 7/2012 | Li et al. |
| 8,248,728 B2 | 8/2012 | Yamaguchi et al. |
| 8,248,896 B1 | 8/2012 | Yuan et al. |
| 8,254,060 B1 | 8/2012 | Shi et al. |
| 8,257,597 B1 | 9/2012 | Guan et al. |
| 8,259,410 B1 | 9/2012 | Bai et al. |
| 8,259,539 B1 | 9/2012 | Hu et al. |
| 8,262,918 B1 | 9/2012 | Li et al. |
| 8,262,919 B1 | 9/2012 | Luo et al. |
| 8,264,797 B2 | 9/2012 | Emley |
| 8,264,798 B1 | 9/2012 | Guan et al. |
| 8,270,126 B1 | 9/2012 | Roy et al. |
| 8,276,258 B1 | 10/2012 | Tran et al. |
| 8,277,669 B1 | 10/2012 | Chen et al. |
| 8,279,719 B1 | 10/2012 | Hu et al. |
| 8,284,517 B1 | 10/2012 | Sun et al. |
| 8,288,204 B1 | 10/2012 | Wang et al. |
| 8,289,649 B2 | 10/2012 | Sasaki et al. |
| 8,289,821 B1 | 10/2012 | Huber |
| 8,291,743 B1 | 10/2012 | Shi et al. |
| 8,307,539 B1 | 11/2012 | Rudy et al. |
| 8,307,540 B1 | 11/2012 | Tran et al. |
| 8,308,921 B1 | 11/2012 | Hiner et al. |
| 8,310,785 B1 | 11/2012 | Zhang et al. |
| 8,310,901 B1 | 11/2012 | Batra et al. |
| 8,315,019 B1 | 11/2012 | Mao et al. |
| 8,316,527 B2 | 11/2012 | Hong et al. |
| 8,320,076 B1 | 11/2012 | Shen et al. |
| 8,320,077 B1 | 11/2012 | Tang et al. |
| 8,320,219 B1 | 11/2012 | Wolf et al. |
| 8,320,220 B1 | 11/2012 | Yuan et al. |
| 8,320,722 B1 | 11/2012 | Yuan et al. |
| 8,322,022 B1 | 12/2012 | Yi et al. |
| 8,322,023 B1 | 12/2012 | Zeng et al. |
| 8,325,569 B1 | 12/2012 | Shi et al. |
| 8,333,008 B1 | 12/2012 | Sin et al. |
| 8,334,093 B2 | 12/2012 | Zhang et al. |
| 8,336,194 B2 | 12/2012 | Yuan et al. |
| 8,339,738 B1 | 12/2012 | Tran et al. |
| 8,341,826 B1 | 1/2013 | Jiang et al. |
| 8,343,319 B1 | 1/2013 | Li et al. |
| 8,343,364 B1 | 1/2013 | Gao et al. |
| 8,349,195 B1 | 1/2013 | Si et al. |
| 8,351,307 B1 | 1/2013 | Wolf et al. |
| 8,357,244 B1 | 1/2013 | Zhao et al. |
| 8,373,945 B1 | 2/2013 | Luo et al. |
| 8,375,564 B1 | 2/2013 | Luo et al. |
| 8,375,565 B2 | 2/2013 | Hu et al. |
| 8,381,391 B2 | 2/2013 | Park et al. |
| 8,385,157 B1 | 2/2013 | Champion et al. |
| 8,385,158 B1 | 2/2013 | Hu et al. |
| 8,394,280 B1 | 3/2013 | Wan et al. |
| 8,400,731 B1 | 3/2013 | Li et al. |

(56) References Cited

U.S. PATENT DOCUMENTS

| | | |
|---|---|---|
| 8,404,128 B1 | 3/2013 | Zhang et al. |
| 8,404,129 B1 | 3/2013 | Luo et al. |
| 8,405,930 B1 | 3/2013 | Li et al. |
| 8,409,453 B1 | 4/2013 | Jiang et al. |
| 8,413,317 B1 | 4/2013 | Wan et al. |
| 8,416,540 B1 | 4/2013 | Li et al. |
| 8,419,953 B1 | 4/2013 | Su et al. |
| 8,419,954 B1 | 4/2013 | Chen et al. |
| 8,422,176 B1 | 4/2013 | Leng et al. |
| 8,422,342 B1 | 4/2013 | Lee |
| 8,422,841 B1 | 4/2013 | Shi et al. |
| 8,424,192 B1 | 4/2013 | Yang et al. |
| 8,441,756 B1 | 5/2013 | Sun et al. |
| 8,443,510 B1 | 5/2013 | Shi et al. |
| 8,444,866 B1 | 5/2013 | Guan et al. |
| 8,449,948 B2 | 5/2013 | Medina et al. |
| 8,451,556 B1 | 5/2013 | Wang et al. |
| 8,451,563 B1 | 5/2013 | Zhang et al. |
| 8,454,846 B1 | 6/2013 | Zhou et al. |
| 8,455,119 B1 | 6/2013 | Jiang et al. |
| 8,456,961 B1 | 6/2013 | Wang et al. |
| 8,456,963 B1 | 6/2013 | Hu et al. |
| 8,456,964 B1 | 6/2013 | Yuan et al. |
| 8,456,966 B1 | 6/2013 | Shi et al. |
| 8,456,967 B1 | 6/2013 | Mallary |
| 8,458,892 B2 | 6/2013 | Si et al. |
| 8,462,592 B1 | 6/2013 | Wolf et al. |
| 8,468,682 B1 | 6/2013 | Zhang |
| 8,472,288 B1 | 6/2013 | Wolf et al. |
| 8,480,911 B1 | 7/2013 | Osugi et al. |
| 8,486,285 B2 | 7/2013 | Zhou et al. |
| 8,486,286 B1 | 7/2013 | Gao et al. |
| 8,488,272 B1 | 7/2013 | Tran et al. |
| 8,491,801 B1 | 7/2013 | Tanner et al. |
| 8,491,802 B1 | 7/2013 | Gao et al. |
| 8,493,693 B1 | 7/2013 | Zheng et al. |
| 8,493,695 B1 | 7/2013 | Kaiser et al. |
| 8,495,813 B1 | 7/2013 | Hu et al. |
| 8,498,084 B1 | 7/2013 | Leng et al. |
| 8,506,828 B1 | 8/2013 | Osugi et al. |
| 8,514,517 B1 | 8/2013 | Batra et al. |
| 8,518,279 B1 | 8/2013 | Wang et al. |
| 8,518,832 B1 | 8/2013 | Yang et al. |
| 8,520,336 B1 | 8/2013 | Liu et al. |
| 8,520,337 B1 | 8/2013 | Liu et al. |
| 8,524,068 B2 | 9/2013 | Medina et al. |
| 8,526,275 B1 | 9/2013 | Yuan et al. |
| 8,531,801 B1 | 9/2013 | Xiao et al. |
| 8,532,450 B1 | 9/2013 | Wang et al. |
| 8,533,937 B1 | 9/2013 | Wang et al. |
| 8,537,494 B1 | 9/2013 | Pan et al. |
| 8,537,495 B1 | 9/2013 | Luo et al. |
| 8,537,502 B1 | 9/2013 | Park et al. |
| 8,545,999 B1 | 10/2013 | Leng et al. |
| 8,547,659 B1 | 10/2013 | Bai et al. |
| 8,547,667 B1 | 10/2013 | Roy et al. |
| 8,547,730 B1 | 10/2013 | Shen et al. |
| 8,555,486 B1 | 10/2013 | Medina et al. |
| 8,559,141 B1 | 10/2013 | Pakala et al. |
| 8,563,146 B1 | 10/2013 | Zhang et al. |
| 8,565,049 B1 | 10/2013 | Tanner et al. |
| 8,576,517 B1 | 11/2013 | Tran et al. |
| 8,578,594 B2 | 11/2013 | Jiang et al. |
| 8,582,238 B1 | 11/2013 | Liu et al. |
| 8,582,241 B1 | 11/2013 | Yu et al. |
| 8,582,253 B1 | 11/2013 | Zheng et al. |
| 8,588,039 B1 | 11/2013 | Shi et al. |
| 8,593,914 B2 | 11/2013 | Wang et al. |
| 8,597,528 B1 | 12/2013 | Roy et al. |
| 8,599,520 B1 | 12/2013 | Liu et al. |
| 8,599,657 B1 | 12/2013 | Lee |
| 8,603,593 B1 | 12/2013 | Roy et al. |
| 8,607,438 B1 | 12/2013 | Gao et al. |
| 8,607,439 B1 | 12/2013 | Wang et al. |
| 8,611,035 B1 | 12/2013 | Bajikar et al. |
| 8,611,054 B1 | 12/2013 | Shang et al. |
| 8,611,055 B1 | 12/2013 | Pakala et al. |
| 8,614,864 B1 | 12/2013 | Hong et al. |
| 8,619,512 B1 | 12/2013 | Yuan et al. |
| 8,625,233 B1 | 1/2014 | Ji et al. |
| 8,625,941 B1 | 1/2014 | Shi et al. |
| 8,628,672 B1 | 1/2014 | Si et al. |
| 8,630,068 B1 | 1/2014 | Mauri et al. |
| 8,634,280 B1 | 1/2014 | Wang et al. |
| 8,638,529 B1 | 1/2014 | Leng et al. |
| 8,643,980 B1 | 2/2014 | Fowler et al. |
| 8,649,123 B1 | 2/2014 | Zhang et al. |
| 8,665,561 B1 | 3/2014 | Knutson et al. |
| 8,670,211 B1 | 3/2014 | Sun et al. |
| 8,670,213 B1 | 3/2014 | Zeng et al. |
| 8,670,214 B1 | 3/2014 | Knutson et al. |
| 8,670,294 B1 | 3/2014 | Shi et al. |
| 8,670,295 B1 | 3/2014 | Hu et al. |
| 8,675,318 B1 | 3/2014 | Ho et al. |
| 8,675,455 B1 | 3/2014 | Krichevsky et al. |
| 8,681,594 B1 | 3/2014 | Shi et al. |
| 8,689,430 B1 | 4/2014 | Chen et al. |
| 8,693,141 B1 | 4/2014 | Elliott et al. |
| 8,703,397 B1 | 4/2014 | Zeng et al. |
| 8,705,205 B1 | 4/2014 | Li et al. |
| 2010/0290157 A1 | 11/2010 | Zhang et al. |
| 2011/0086240 A1 | 4/2011 | Xiang et al. |
| 2012/0111826 A1 | 5/2012 | Chen et al. |
| 2012/0216378 A1 | 8/2012 | Emley et al. |
| 2012/0237878 A1 | 9/2012 | Zeng et al. |
| 2012/0298621 A1 | 11/2012 | Gao |
| 2013/0216702 A1 | 8/2013 | Kaiser et al. |
| 2013/0216863 A1 | 8/2013 | Li et al. |
| 2013/0257421 A1 | 10/2013 | Shang et al. |
| 2014/0154529 A1* | 6/2014 | Yang et al. .................. 428/811.1 |

OTHER PUBLICATIONS (Jose A. Medina, et al.), U.S. Appl. No. 13/221,726, filed Aug. 30, 2012, 14 pages.

(Jose A. Medina, et al.), U.S. Appl. No. 13/312,932, filed Dec. 6, 2011, 23 pages.

* cited by examiner

METHOD AND SYSTEM FOR PROVIDING A READ TRANSDUCER HAVING SEAMLESS INTERFACES

BACKGROUND

FIG. 1 is a conventional method 10 for providing a read transducer. A read sensor is provided, via step 12. The read sensor is on a first shield. The read sensor may be a tunneling magnetoresistive sensor. In addition, the read sensor may have an in-stack NiFe spacer. Such a spacer is typically between the read sensor and a second shield. Magnetic bias structures are provided adjacent to the read sensor, via step 14. In some conventional transducers, the magnetic bias structure includes hard magnetic materials. Typically, the hard bias materials have a capping layer. In more recently developed magnetic transducers, the magnetic bias structure may be a soft magnetic bias structure. A nonmagnetic capping layer is deposited on the portions of the transducers via step 16. The capping layer typically includes Ru and/or Ta. For example, a Ru/Ta bilayer may be used. The capping layer may be used for a chemical mechanical planarization and/or other processing. The top shield is provided, via step 18. Providing the top shield typically includes sputter etching the Ru/Ta capping layer to remove the capping layer and clean the exposed surface.

FIGS. 2 and 3 depict an air-bearing surface (ABS) view of conventional read transducers 50 and 50', respectively. The conventional read transducer 50 includes shields 52 and 60, sensor 54, in stack NiFe spacer layer 62 and hard magnetic bias structures 58 having capping layer 59. The conventional read transducer 50' includes shields 52' and 60', sensor 54' and soft magnetic bias structures 58'. The read sensor 54 is typically a giant magnetoresistive (GMR) sensor or tunneling magnetoresistive (TMR) sensor. The read sensor 54 typically includes an antiferromagnetic (AFM) layer, a pinned layer, a nonmagnetic spacer layer, and a free layer.

Although the conventional transducers 50 and 50' may function, there are drawbacks. The transducer 50 may have nonmagnetic residue 62 between the NiFe spacer 56 and the shield 60. The nonmagnetic residue 62 may include Ta and/or Ru that redeposits during to the method 10. The nonmagnetic residue 62 may magnetically decouple the NiFe spacer layer 56 from the shield 60. Consequently, the effective shield-to-shield spacing may be increased. Similarly, the transducer 50' may have nonmagnetic residue 62' between the shield 60' and soft magnetic bias structure 58'. The nonmagnetic residue 62' would decouple the magnetically soft bias structures 58' from the shield 60'. Thus, the performance of the magnetic transducer 50' would also be adversely affected.

Accordingly, what is needed is a system and method for improving the performance of a magnetic recording read transducer.

BRIEF SUMMARY OF THE INVENTION

A method and system provide a substantially seamless interface in a magnetic transducer. The magnetic recording transducer includes a first layer and a second layer on the first layer. The second layer is different from the first layer. The first layer consists of at least one material. The method includes removing at least the second layer using a first removal process. A residue of the second layer and a first portion of the first layer remain after completion of the first removal process. A first sacrificial layer consists of the at least one material on the first portion of the first layer. At least the first sacrificial layer is removed using a second removal process. A second portion of the first layer remains after completion of the second removal process. An additional structure is provided. The seamless interface is between the second portion of the first layer and the additional structure.

DETAILED DESCRIPTION OF THE PREFERRED EMBODIMENTS

Figure 1:
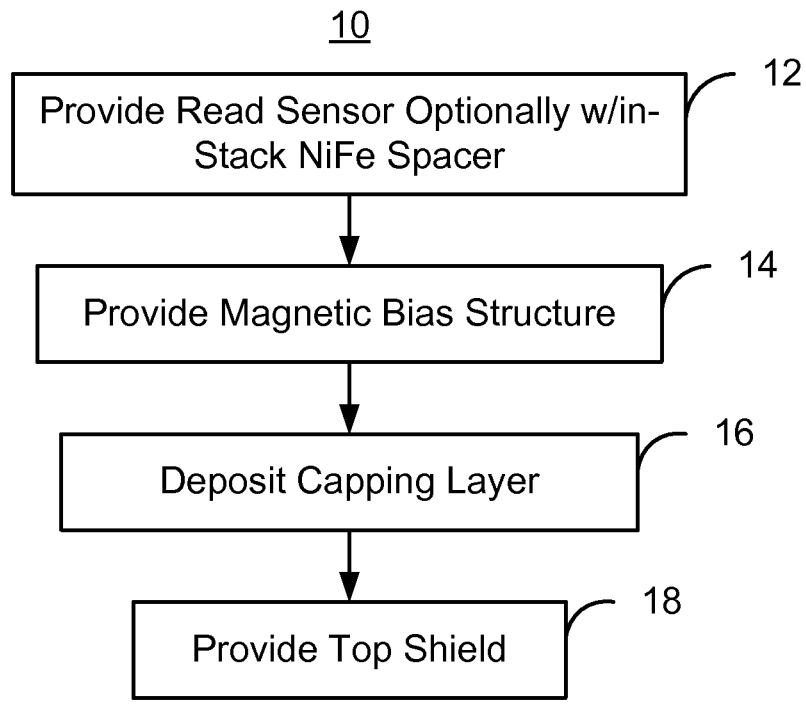
FIG. 1 is a flow chart depicting a method for providing a conventional read transducer.
Figure 2:
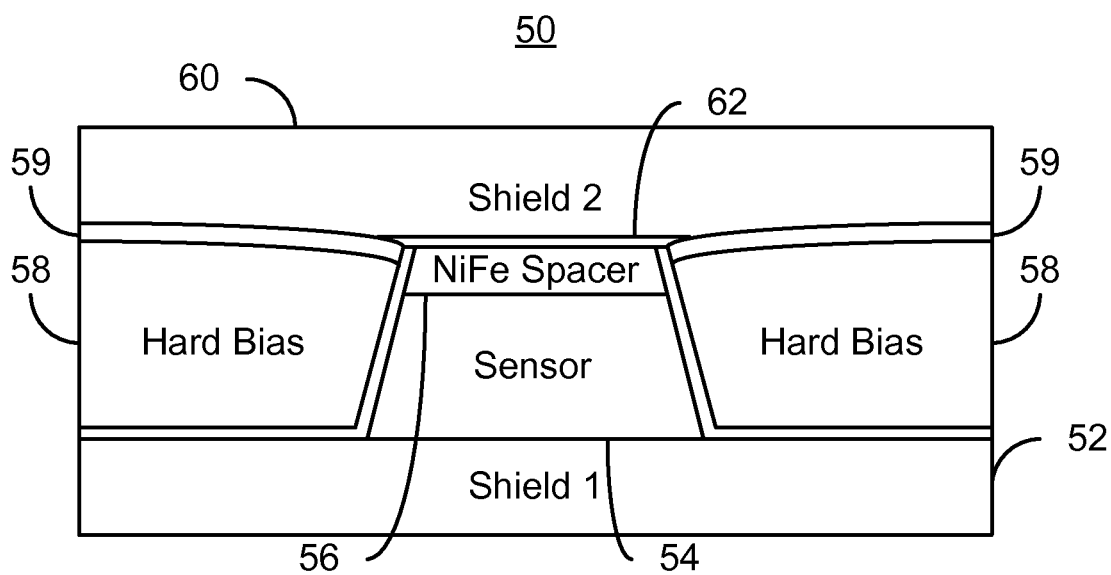
FIG. 2 depicts an ABS view of a conventional read transducer.
Figure 3:
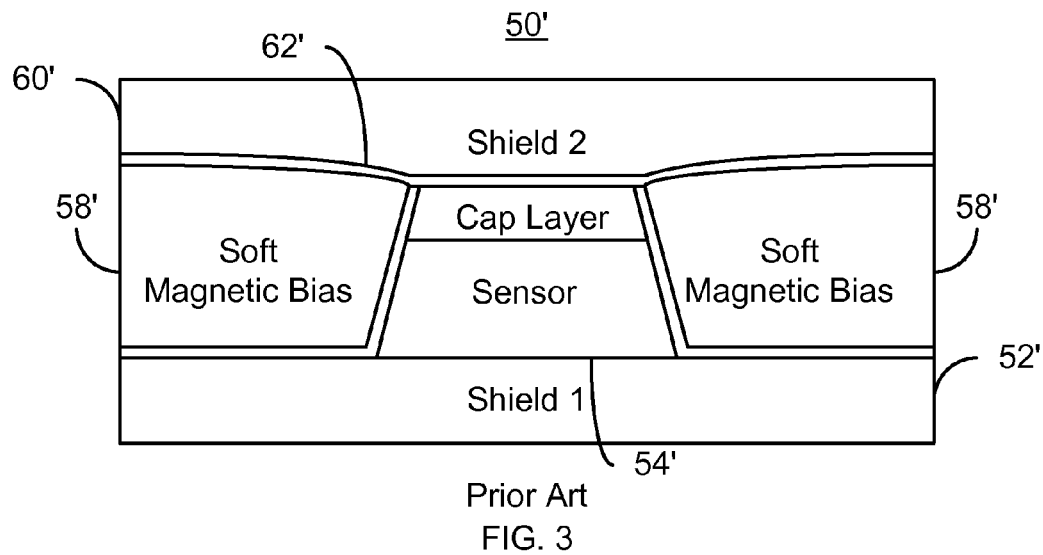
FIG. 3 depicts an ABS view of a conventional read transducer.
Figure 4:
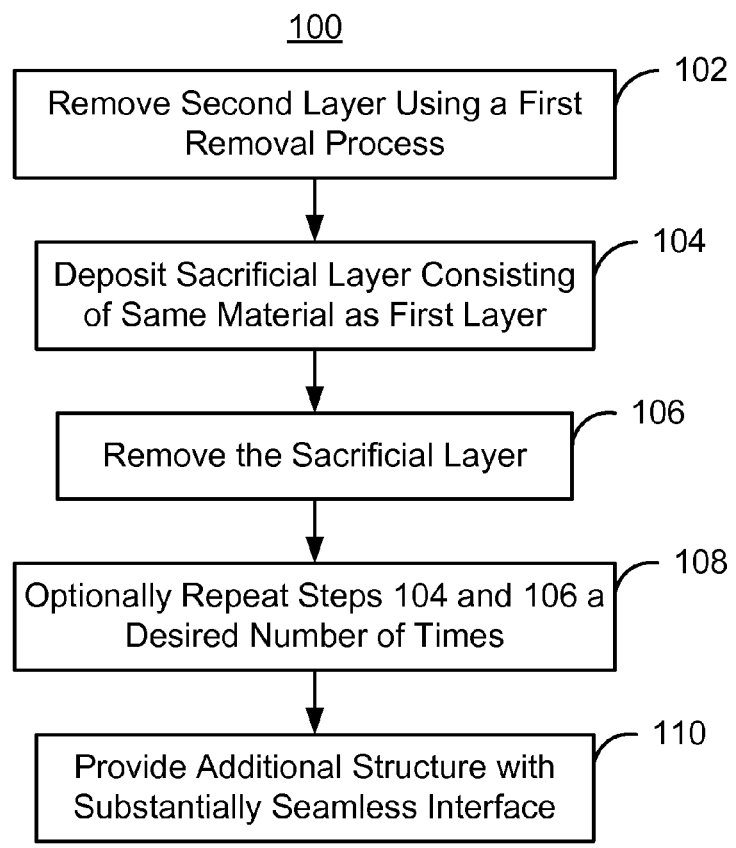
FIG. 4 is flow chart depicting an exemplary embodiment of a method for fabricating a magnetic recording transducer.

FIG. 4 is flow chart depicting an exemplary embodiment of a method 100 for fabricating a magnetic recording transducer. For simplicity, some steps may be omitted, interleaved, and/or combined. FIGS. 5A-5D depict an exemplary embodiment of a portion of a magnetic recording transducer 150 during fabrication. For clarity, FIGS. 5A-5D are not to scale. The method 100 is also described in the context of providing a single magnetic recording transducer 150. However, the method 100 may be used to fabricate multiple transducers at substantially the same time. The method 100 is also described in the context of particular layers. A particular layer may include multiple materials and/or multiple sub-layers. The method 100 also may start after formation of other portions of the magnetic recording transducer.

Figure 5A:
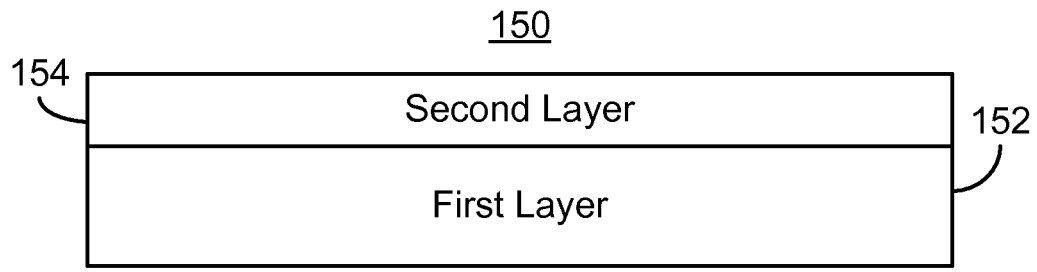
FIGS. 5A-5D depict an exemplary embodiment of a portion of a magnetic recording transducer during fabrication.

FIG. 5A depicts the transducer before the method 100 starts. Thus, the transducer includes a first layer 152 and a second layer 154 on the first layer 152. In some embodiments, the first layer 152 is NiFe, while the second layer 154 includes Ta and/or Ru. Thus, the first layer 152 is different from the second layer 154. In some embodiments, the first layer 153 is magnetic while the second layer 154 is nonmagnetic. For example, the first layer 152 may form or be part of a soft magnetic bias structure or an in-stack spacer layer while the second layer is a capping layer 154. In some embodiments, the first layer 152 is thin. For example, the first layer 152 may be at least ten Angstroms and not more than one hundred Angstroms. In some embodiments, the first layer 152 is at least twenty Angstroms thick and not more than fifty Angstroms thick. In some such embodiments, the thickness of the first layer is at least thirty Angstroms. Because the first layer 152 is relatively thin, the amount which the magnetic transducer 150 can be overmilled may be limited. In the embodiments shown in FIGS. 5A-5D, the second layer 154 is thinner than the first layer 154. However, in other embodiments, the second layer 154 may be as thick as and/or thicker than the first layer 152. For example, in some embodiments, the second layer 154 is at least twenty Angstroms thick.

Figure 5B:
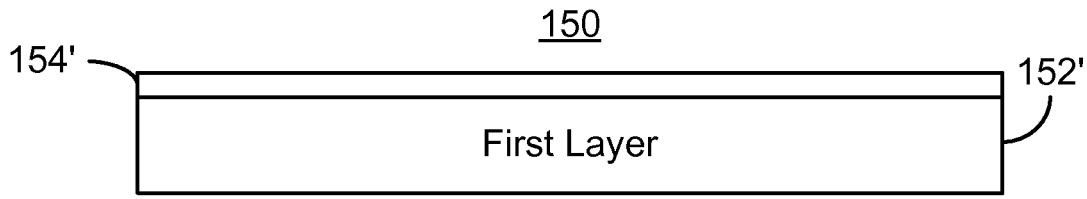

The second layer 154 is desired to be removed. Thus, a first removal process is used to remove the second layer, via step 102. The removal process of step 102 may be an ion beam etch (IBE). However, in other embodiments, other removal processes might be used. In some embodiments, step 102 includes ion beam etching the second layer. In addition, the removal process performed in step 102 may overetch the second layer 154. Thus, a portion of the first layer 152 may be removed. For example, the removal process may remove not more than ten Angstroms of the first layer 152. FIG. 5B depicts the transducer 150 after step 102 is performed. The second layer 154 has been removed. In some embodiments, the first layer 152' has also been thinned by the removal process. However, this removal process still leaves a residue 154' on the first layer 152'. Because the first layer 152' may be thin, overetching the magnetic transducer 150 may be limited. Overetching to a larger extent may remove the first layer 152 or otherwise adversely affect performance of the magnetic transducer 150. Thus, the removal in step 102 may not be carried out until the residue 154' is removed.

Figure 5C:
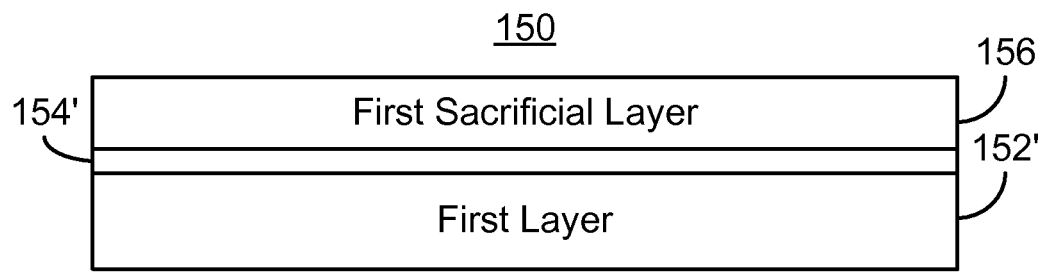

A first sacrificial layer consisting of the material(s) in the first layer 152' is provided on the remaining part of the first layer 152', via step 104. In some embodiments, step 104 includes depositing a sacrificial NiFe layer. The deposition may be carried out using ion beam deposition (IBD). Further, the IBD may occur in the same chamber in which step 102 was carried out. FIG. 5C depicts the transducer 150 after step 104 is carried out. Thus, the first sacrificial layer 156 is shown. The sacrificial layer 156 provided in step 104 may have the same thickness as the overetch of the underlying layer 154'. For example, the first sacrificial layer 156 may be ten Angstroms thick. In other embodiments, the first sacrificial layer 156 may have another thickness including but not limited to a thickness that matches that of the second layer 154.

At least part of the first sacrificial layer 104 is removed a second removal process, via step 106. In some embodiments, step 106 includes performing another IBE. However, in other embodiments, other removal process(es) may be used. Step 106 may also overetch, removing part of the underlying layer 152'. Further, the residue 154' may be removed. In some embodiments, all of the residue 154' may be removed. In other embodiments, some residue remains after step 106 is completed. In some embodiments, a full film of the residue remains while in other cases, the residue may only partially cover the underlayers or may be completely removed. In some embodiments, the overetch removes more of the underlying layer 152'. Thus, a second portion of the first layer remains after completion of the second removal process in step 106.

Steps 104 and 106 may optionally be repeated a desired number of times, via step 108. Thus, additional sacrificial layer(s) may be deposited and removed. Each removal process may overetch the remaining structures. The effect of steps 104, 106 and 108 may be seen as diluting the amount of residue 154' present on the portion of the magnetic recording transducer 150 that is already fabricated. In repeating steps 104 and 106, however, the thickness(es) of the sacrificial layer(s) deposited and the amount(s) which are removed/overetched may be varied. Thus, the thickness(es) of the sacrificial layer(s) deposited and the amount of material removed need not be kept the same for subsequent iterations. However, additional sacrificial layer(s) deposited may still be desired to be at least ten Angstroms thick in some embodiments. in some embodiments, the same deposition and removal processes may be used. For example, IBD and IBE may be used to deposit and remove sacrificial layers. Such processes may be carried out in the same chamber as for the steps 104 and 106 of the method 100.

An additional structure is provided, via step 110. The additional structure is made of the same material as the sacrificial layer(s) and the first layer. Thus, the material has been deposited in step 110. Other processing steps including but not limited to photolithography and annealing may also have been performed. In some embodiments, the material for the additional structure may be provided in the same manner as the sacrificial layer(s) in steps 104 and 108. The method may also include sputter etching the top surface of the magnetic transducer 150 before the additional structure is provided. In such a case, the last sacrificial layer deposited may be sputter etched before the step of providing the additional structure.

Figure 5D:
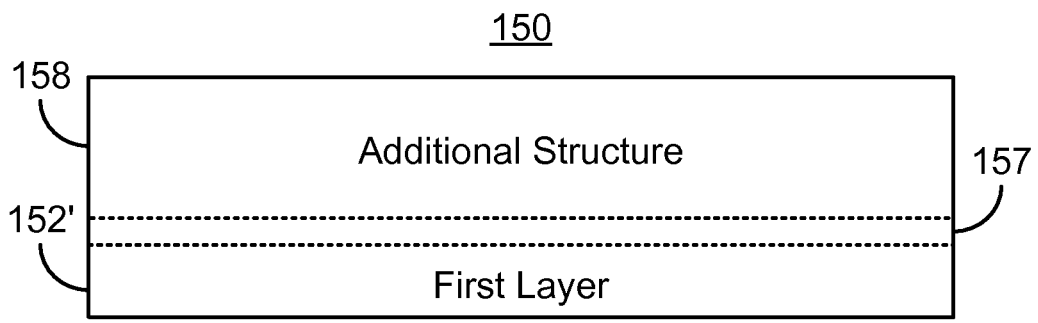

FIG. 5D depicts the magnetic transducer 150 after step 110 is performed. Thus, additional structure 158 has been formed. For example, the additional structure may be a second (trailing) shield. Such a shield may consist of NiFe. As discussed above, the first layer 152 may be a NiFe spacer layer above the magnetoresistive sensor or a NiFe soft bias structure. In the embodiment shown, there is some portion of an additional sacrificial layer 157 between the first layer 152' and the additional structure. In other embodiments, this layer would have been completely removed and only the first layer 152' and additional structure 158 would be present.

Because the method 100 has been used, one or more seamless interfaces exist between the first layer 152' and the additional structure 158. These are shown by dashed lines. In the embodiment shown, there is a seamless interface between the first layer 152' and the layer 157 and another between the layer 157 and the additional structure 158. More specifically, because the process of depositing sacrificial layer(s) and removing the sacrificial layers/residue (particularly including an overetch), the material corresponding to the second layer 154/154' has been removed or sufficiently diluted that there is substantially no residue present. Instead, there is a smooth transition between the first layer 152' and the additional structure 158. In other words, a seamless interface exists between the remaining portion of the first layer 154' and the additional structure 158. The layers 152', 157 and 158 may thus appear as a single layer in a micrograph. Further, the seamless interface has been provided without etching through the first layer 152'. Thus, performance of the magnetic transducer 150 may be enhanced.

Figure 6:
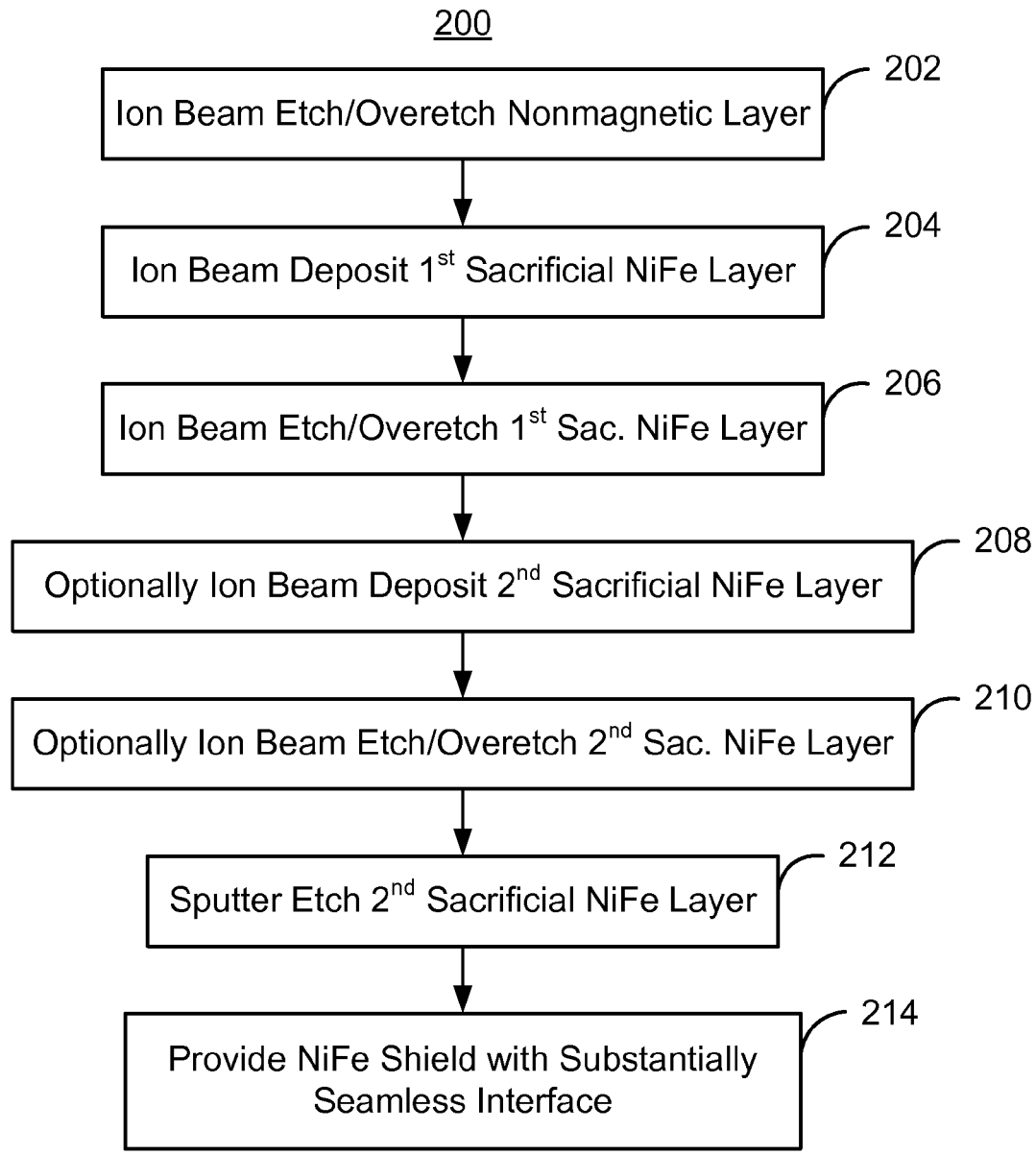
FIG. 6 is flow chart depicting an exemplary embodiment of a method for fabricating a magnetic recording transducer.

FIG. 6 is flow chart depicting an exemplary embodiment of a method 200 for fabricating a magnetic recording read transducer. For simplicity, some steps may be omitted, interleaved, and/or combined. FIGS. 7A-7G depict an exemplary embodiment of a portion of a magnetic recording transducer 250 during fabrication. For clarity, FIGS. 7A-7G are not to scale. FIGS. 8A-8G depict another exemplary embodiment of a portion of another magnetic recording transducer 280 during fabrication. For clarity, FIGS. 8A-8G are not to scale. The method 200 is described in the context of providing a single magnetic recording transducer 250 and 280. However, the method 200 may be used to fabricate multiple transducers at substantially the same time. The method 200 and transducer 250/280 also described in the context of particular layers and particular materials. A particular layer may include multiple materials and/or multiple sub-layers. Further, other materials may be used. The method 200 also may start after formation of other portions of the magnetic recording transducer.

Figure 7A:
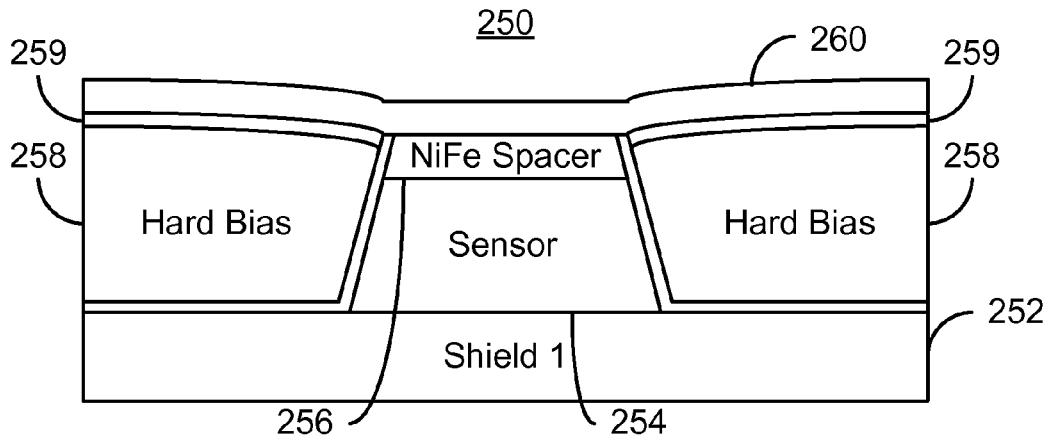
FIGS. 7A-7G depict another exemplary embodiment of a magnetic recording read transducer during fabrication.
Figure 8A:
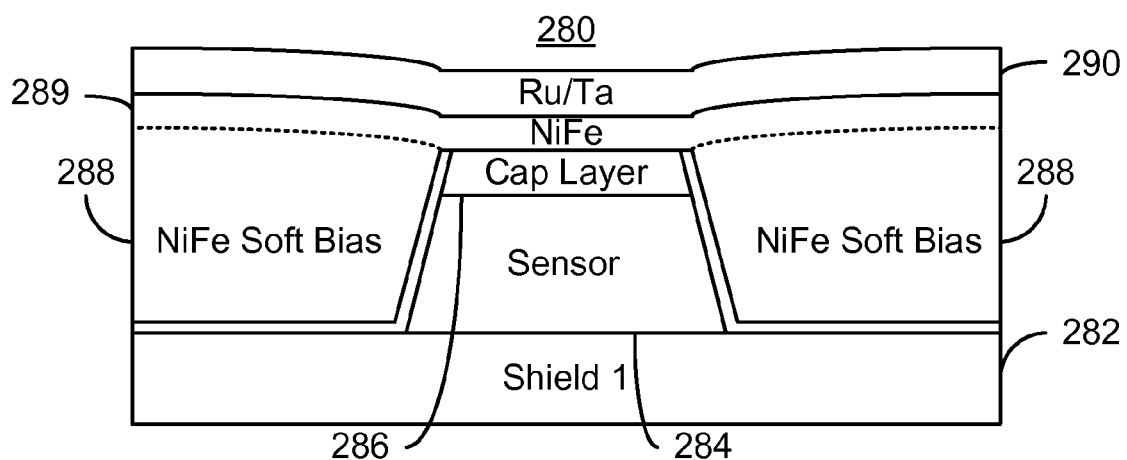
FIGS. 8A-8G depict another exemplary embodiment of a magnetic recording read transducer during fabrication.

FIGS. 7A and 8A depicts the transducer 250 and 280, respectively, before the method 200 starts. Thus, the transducer 250 includes a shield 252, a sensor 254, a NiFe spacer layer 256 and hard bias structures 258 having capping layers 259. A Ru/Ta bilayer 260 is also shown. The Ru/Ta bilayer 260 covers the capping layer 259 and the NiFe spacer 256. The NiFe spacer 256 is in-stack, or directly in line with the sensor 254 in the down track direction. The sensor 254 may be a tunneling magnetoresistive sensor, a giant magnetoresistive sensor or another sensor. The NiFe spacer layer 256 may be thin. For example, the NiFe spacer layer 256 may be least twenty Angstroms thick and not more than fifty Angstroms thick. Similarly, the transducer 280 includes a shield 282, a sensor 284, a capping layer 286, soft bias structures 288 and a NiFe capping layer 289. As both structures 288 and 289 may be formed of NiFe, a seamless interface between the layers is depicted by a dashed line in FIG. 8A. A Ru/Ta bilayer 290 is also shown. The Ru/Ta bilayer 290 covers the capping layer 286 and the NiFe capping layer 289. The sensor 284 may be a tunneling magnetoresistive sensor, a giant magnetoresistive sensor or another sensor. The capping layer 256 may be thin. The Ru/Ta bilayers 260 and 290 may be used to protect the underlying layers from corrosion or damage during processing such as chemical mechanical planarization steps.

Figure 7B:
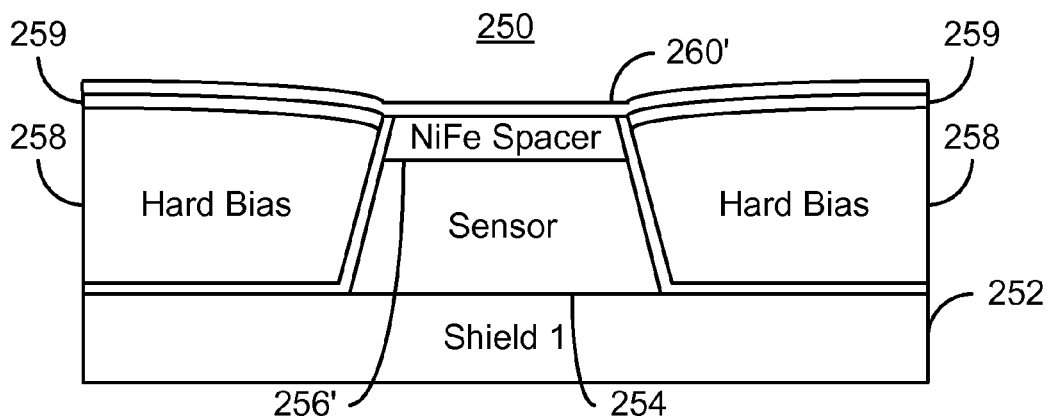
Figure 8B:
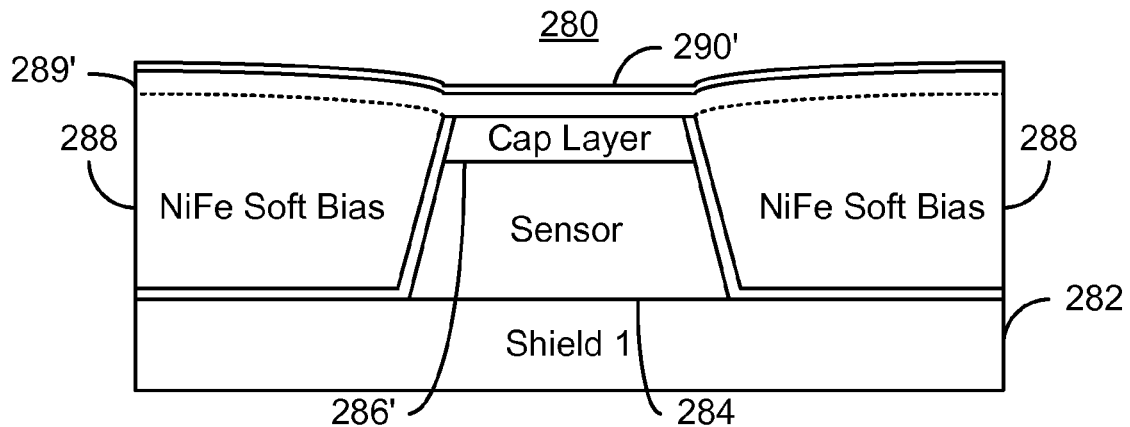

An IBE removal process is used to remove the Ru/Ta layer 260/290, via step 202. In addition, the removal process performed in step 102 may overetch the NiFe layers 256 and 289. Thus, a portion of the NiFe spacer layer 256 and a portion of the NiFe cap 289 may be removed. For example, the removal process may remove not more than ten Angstroms of the NiFe spacer layer 256 and the NiFe capping layer 289. FIG. 7B depicts the transducer 250 after step 202 is performed. The Ru/Ta bilayer 260 has been removed. In some embodiments, the NiFe spacer layer 256' has also been thinned by the removal process. However, this removal process still leaves a residue 260' on the NiFe spacer layer 256', as well as on the hard bias structures 258. Similarly, FIG. 8B depicts the transducer 280 after step 202 has been performed. The Ru/Ta bilayer 290 has been removed. The NiFe capping layer 289' may also have been thinned by the IBE performed in step 202. A residue 290' similar to the residue 260' remains on the transducer 280. Because the NiFe spacer layer 256 and capping layer 286 may be thin, overetching the magnetic transducer 150 may be limited. Overetching to a larger extent may remove the NiFe spacer layer 256' or the capping layer 286. Thus, the removal in step 2 may not be carried out until the residue 260' is removed.

Figure 7C:
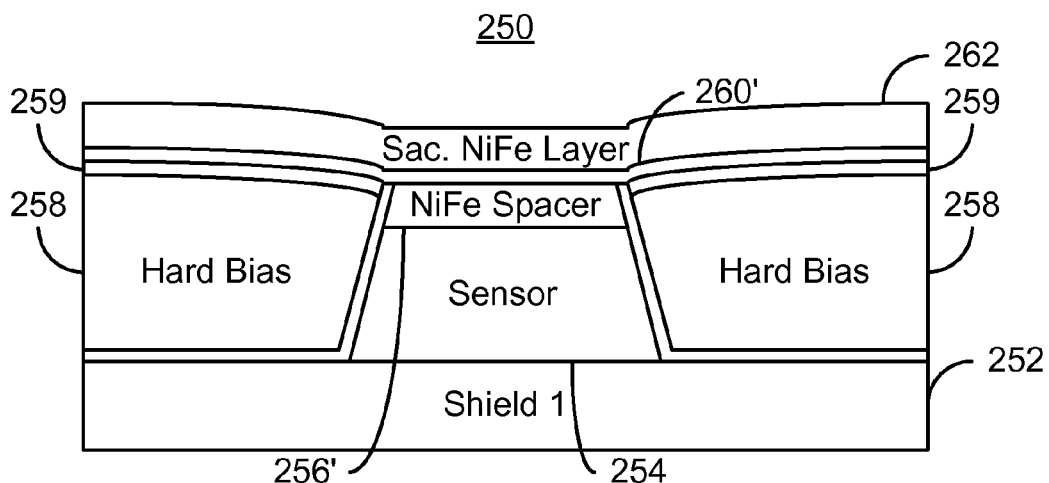
Figure 8C:
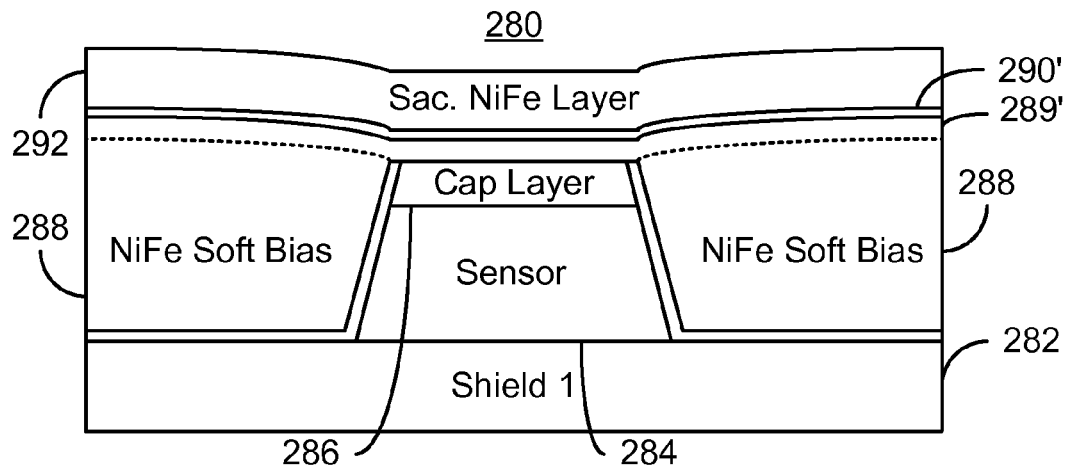

A first NiFe sacrificial layer is provided using IBD, via step 204. The IBD of step 204 may occur in the same chamber in which step 202 was carried out. NiFe is used because the layers 256' and 288 are desired to have seamless transitions to upper layers. FIG. 7C depicts the transducer 250 after step 204 is carried out. Thus, the first sacrificial NiFe layer 262 is shown. Similarly, FIG. 8C depicts the transducer 280 after step 204 is performed. Thus, the first sacrificial NiFe layer 292 has been deposited. The sacrificial layer 262/292 provided in step 204 may have the same thickness as the overetch of the underlying layer 256'/289'. For example, the first sacrificial NiFe layer 262/292 may be ten Angstroms thick. In other embodiments, the first sacrificial NiFe layer 262/292 may have another thickness including but not limited to a thickness that matches that of the Ru/Ta layers 260/290.

At least part of the first sacrificial NiFe layer 262/292 is removed using another IBE, via step 206. Step 206 may also overetch, removing part of the underlying layers 256'/289'. Further, the residue 260'/290' may be removed. In some embodiments, all of the residue 260'/290' may be removed. In other embodiments, some residue remains after step 206 is completed. In some embodiments, the overetch removes more of the underlying layer 256'/289'.

Figure 7D:
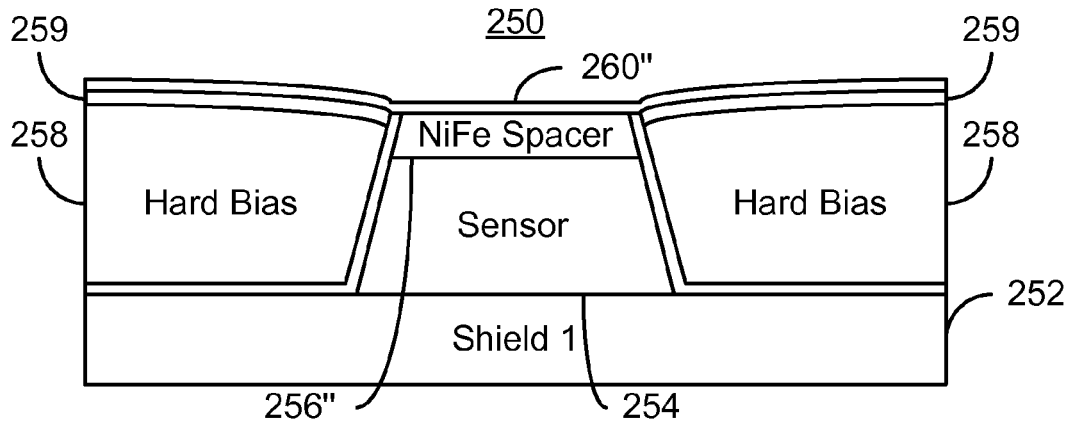
Figure 8D:
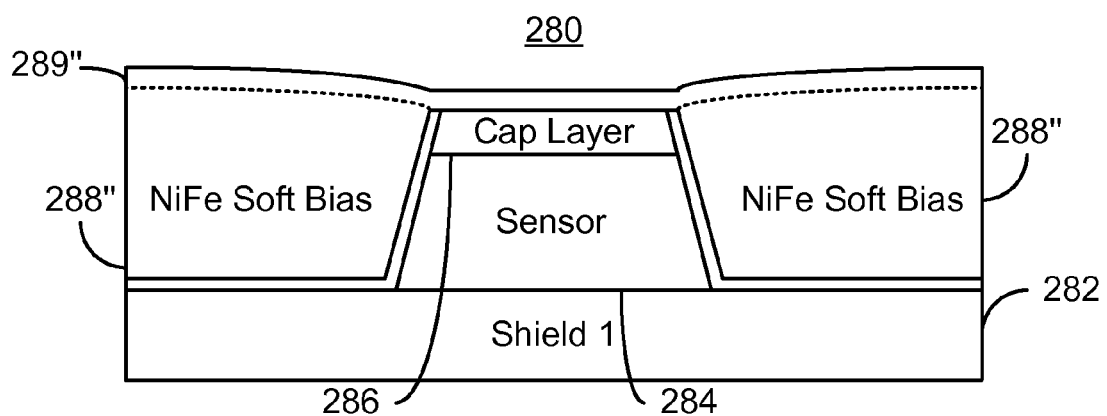

FIG. 7D depicts the transducer 250 after step 206 is performed. The sacrificial NiFe layer 262 has been removed. A smaller amount of the residue 260" remains. Thus, a second portion of the NiFe spacer layer 256" remains after completion of the second removal process in step 206. Similarly, FIG. 8D depicts the transducer 280 after step 206 is performed. However, for the transducer 280, the residue 290' has been completely removed. In addition, a portion of the underlying NiFe capping layer 289' may be removed, leaving NiFe capping layer 289".

Figure 7E:
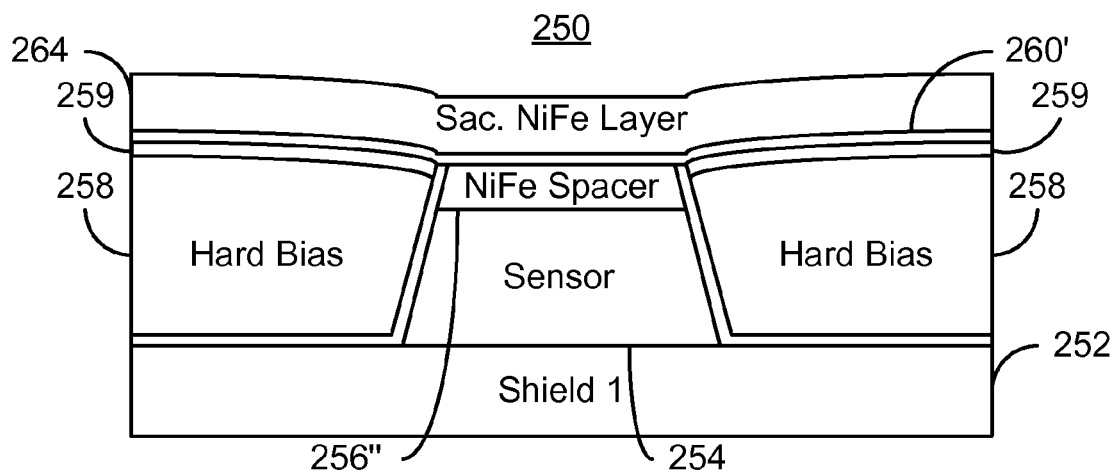
Figure 8E:
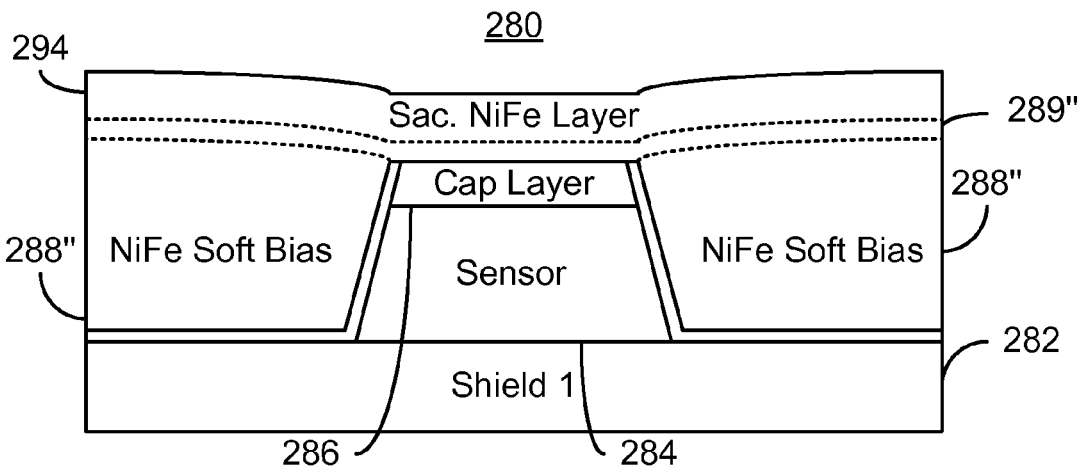

An additional sacrificial NiFe layer may be deposited, via step 208. Step 208 is performed via an IBD. The IBD of step 208 may occur in the same chamber in which steps 202, 204 and 206 were carried out. NiFe is used because the layers 256' and 289' are desired to have seamless transitions to upper layers. FIG. 7E depicts the transducer 250 after step 208 is carried out. Thus, the second sacrificial NiFe layer 264 is shown on the residue 260'. FIG. 8E depicts the transducer 280 after step 208 is carried out. Thus, the second sacrificial NiFe layer 294 has been deposited. The sacrificial layer 264/294 provided in step 208 may have the same thickness as the overetch of step 206. In other embodiments, the second sacrificial NiFe layer 264/294 may have another thickness.

Figure 7F:
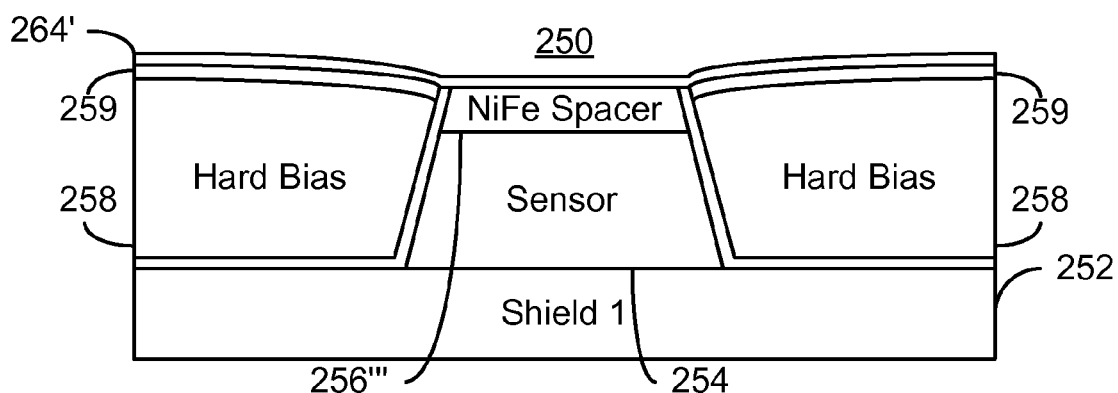
Figure 8F:
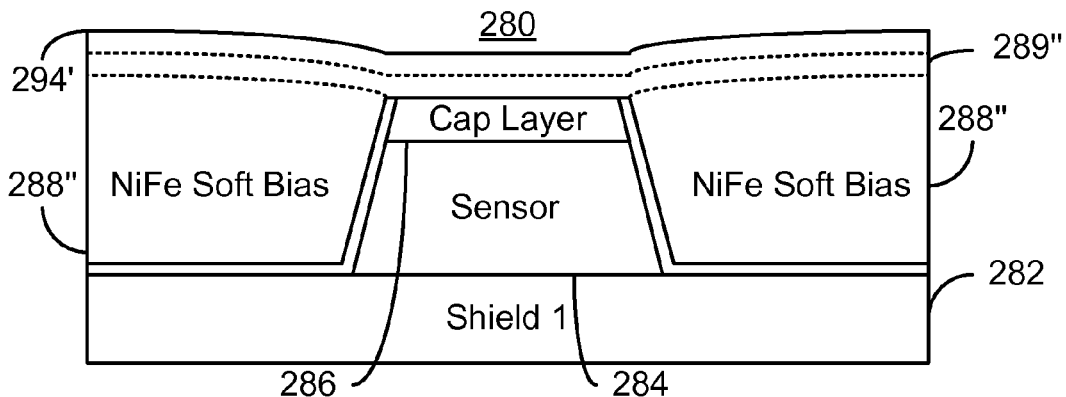
Figure 8G:
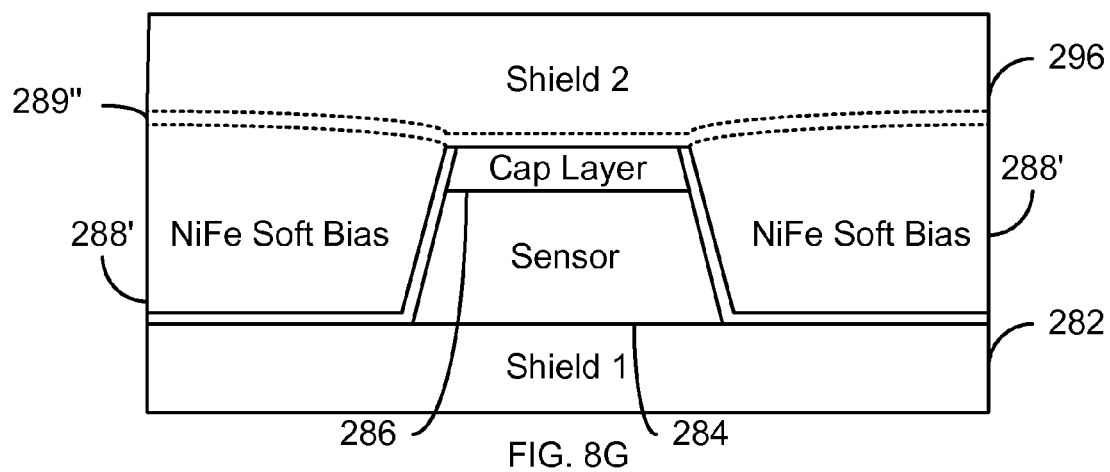

Another IBE is optionally performed, via step 210. Step 210 may also overetch, removing part of the underlying layers 260'/289". Further, the residue 260" may be removed. In some embodiments, all of the residue 260" may be removed. In some embodiments, the overetch removes more of the underlying layer. FIG. 7F depicts the transducer 250 after step 210 is performed. Thus, the residue 260" has been removed. In some embodiments, a portion of the second NiFe sacrificial layer 264' remains. Although shown as a full film, the layer 264' may only partially cover the underlayers or may be completely removed. In addition, a remaining portion of the NiFe spacer layer 256" is exposed. Similarly, FIG. 8F depicts the transducer after step 210 is performed. Thus, the NiFe capping layer 289" may be exposed. In some embodiments, a portion of the second NiFe sacrificial layer 294' remains. Although shown as a full film, the layer 294' may only partially cover the underlayers or may be completely removed. Although not indicated, steps 204, 206, 208, and/or 210 may be repeated a desired number of times.

Any remaining portion of the second sacrificial NiFe layer 264'/294' as well as an exposed portions of the underlying layer(s) are cleaned using a sputter etch, via step 212. An additional structure is provided, via step 214. The additional structure is a NiFe top shield. In some embodiments, the NiFe for the shield is provided by IBD. Thus, the steps 202-214 of the method 200 may be performed in a single chamber.

Figure 7G:
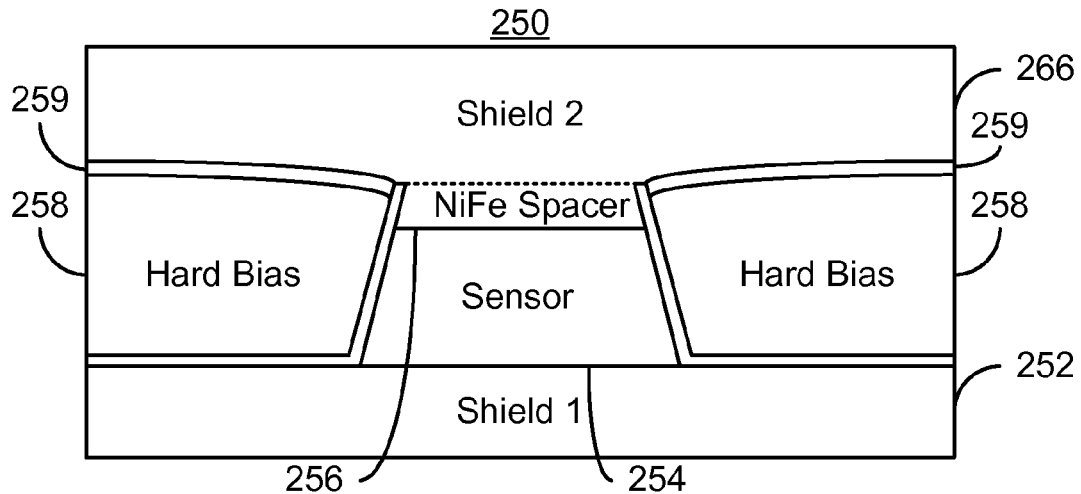

FIG. 7G depicts the magnetic transducer 250 after step 214 is performed. Thus, the shield 266 has been formed. The shield 266 may consist of NiFe. Similarly, 8G depicts the magnetic transducer 280 after step 214 is performed. Thus, the shield 296 has been provided and NiFe sacrificial layer 294' removed. In the embodiment, there may be some portion the sacrificial layer(s) remaining between the NiFe spacer layer 256"/NiFe capping layer 289" and the shield 266/296. In other embodiments, the sacrificial layer(s) are completely removed and only the NiFe spacer layer 256"/NiFe capping layer 289" would be present.

Because the method 200 has been used, one or more seamless interfaces exist between the NiFe spacer layer 256' and the shield 266" and between the NiFe soft bias structure 288/NiFe capping layer 289" and the shield 296. These interfaces are shown by dashed lines. Because the process of depositing sacrificial layer(s) and removing the sacrificial layers/residue (particularly including an overetch), the material corresponding to the second layer 260/290 has been removed or sufficiently diluted that there is substantially no residue present. Instead, there is a smooth transition between the NiFe spacer layer 256'/NiFe soft bias structure 288 and the shield 266/296. In other words, a seamless interface exists between the remaining portion of the NiFe spacer layer 256'/NiFe soft bias structure 288 and the shield 266/296. Further, the seamless interface has been provided without etching through the NiFe spacer layer 256'/NiFe capping layer 289". Thus, performance of the magnetic transducer 250/280 may be enhanced.

Figure 9:
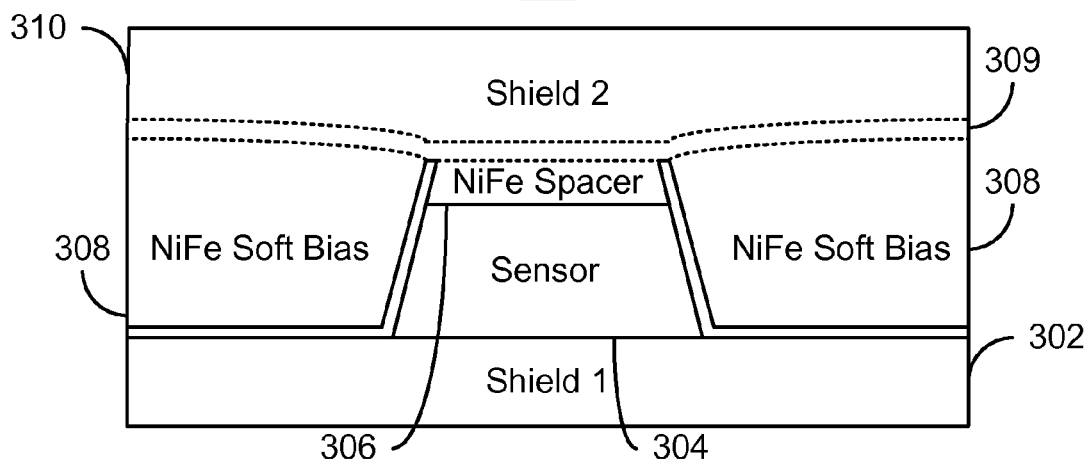
FIG. 9 depicts another exemplary embodiment of a portion of a magnetic recording read transducer.

FIG. 9 depicts another exemplary embodiment of a portion of a magnetic recording read transducer 300 formed using the method 100 and/or 200. The magnetic recording transducer 300 is analogous to the transducers 250 and 280. The transducer 300 thus includes a shield 302, sensor 304, NiFe spacer 306, NiFe soft bias structures 308, NiFe capping layer 309 and shield 310 that are analogous to the shield 252/282, sensor 254/284, NiFe spacer 256, NiFe soft bias structures 288', NiFe capping layer 289 and shield 266/296. However, in this embodiment, both a NiFe spacer 306 and NiFe soft bias structures 308 are present. Thus, there may be seamless transitions both between the NiFe spacer 306 and the shield 310 and between the NiFe soft bias structures 308 and the shield 310. Thus, the transducer 300 may share the benefits of the transducers 250 and/or 280.

We claim:

1. A method for providing a substantially seamless interface in a magnetic recording transducer, the magnetic recording transducer including a first layer and a second layer on the first layer, the second layer being different from the first layer, the first layer consisting of at least one material, the method comprising:
   removing at least the second layer using a first removal process, a residue of the second layer and a first portion of the first layer remaining after completion of the first removal process;
   depositing a first sacrificial layer consisting of the at least one material on the first portion of the first layer;
   removing at least the first sacrificial layer using a second removal process, a second portion of the first layer remaining after completion of the second removal process; and
   providing an additional structure, the substantially seamless interface being between the second portion of the first layer and the additional structure.

2. The method of claim 1 further comprising:
   depositing a second sacrificial layer after the step of removing the first sacrificial layer and before the step of providing the additional structure, the second sacrificial layer consisting of the at least one material.

3. The method of claim 2 wherein the second sacrificial layer has a thickness of at least ten Angstroms.

4. The method of claim 2 further comprising:
   sputter etching the second sacrificial layer before the step of providing the additional structure.

5. The method of claim 1 wherein the transducer further includes a magnetoresistive sensor under the first layer.

6. The method of claim 1 wherein the at least one material is NiFe.

7. The method of claim 6 wherein the first layer includes a NiFe spacer layer directly above a magnetoresistive sensor.

8. The method of claim 6 wherein the first layer includes a soft bias layer.

9. The method of claim 6 wherein the additional structure includes a shield.

10. The method of claim 9 wherein the shield consists of NiFe.

11. The method of claim 6 wherein the second layer includes Ru.

12. The method of claim 1 wherein the first removal process and the second removal process each includes an ion beam etch.

13. The method of claim 12 wherein the step of depositing the first sacrificial layer further includes:
   ion beam depositing the first sacrificial layer.

14. The method of claim 1 wherein the second layer is at least twenty Angstroms thick and wherein the first removal step removes not more than ten Angstroms of the first layer.

15. The method of claim 14 wherein the first sacrificial layer has a thickness of at least ten Angstroms.

16. The method of claim 15 wherein the thickness is at least thirty Angstroms and not more than fifty Angstroms.

17. The method of claim 1 wherein the second layer has a first thickness and wherein the first sacrificial layer has substantially the first thickness.

18. The method of claim 17 wherein the step of removing the first sacrificial layer overmills the first layer by a second thickness, the method further comprising:
   depositing a second sacrificial layer after the step of removing the first sacrificial layer and before the step of providing the additional structure, the second sacrificial layer consisting of the material, the second sacrificial layer having substantially the second thickness.

19. The method of claim 1 wherein the steps of removing the at least the second layer, depositing the first sacrificial layer, removing the at least the first sacrificial layer and providing the additional structure are performed in a single chamber.

20. A method for providing a substantially seamless interface in a magnetic recording transducer, the magnetic recording transducer including a magnetoresistive sensor, a NiFe spacer layer on the magnetoresistive sensor, a NiFe soft bias structure adjacent to the magnetoresistive sensor, and a nonmagnetic layer on the NiFe spacer layer and the NiFe soft bias structure, the method comprising:
   performing a first ion beam etch of at least the nonmagnetic layer, a residue of the nonmagnetic layer, a first portion of the NiFe spacer layer and a first portion the NiFe soft bias structure remaining after completion of the first ion beam etch;
   ion beam depositing a first sacrificial NiFe layer on the first portion of the NiFe spacer layer and the first portion of the NiFe soft bias structure;
   performing a second ion beam etch of at least the first sacrificial NiFe layer, a second portion of the NiFe spacer layer and a second portion the NiFe soft bias structure remaining after the second ion beam etch;
   ion beam depositing a second sacrificial NiFe layer after the second ion beam etch;
   sputter etching the second sacrificial NiFe layer; and
   providing a NiFe shield, the substantially seamless interface being between the second portion of the NiFe spacer layer and the NiFe shield and between the second portion of the NiFe soft bias structure and the NiFe shield.

21. The method of claim 20 wherein the nonmagnetic layer has a first thickness and wherein the first sacrificial NiFe layer has substantially the first thickness.

22. The method of claim 21 wherein the second ion beam etch overmills the NiFe spacer layer and the NiFe soft bias structure by a second thickness, the second sacrificial NiFe layer having substantially the second thickness.

* * * * *